United States Patent [19]
Nardozza

[11] Patent Number: 5,136,264
[45] Date of Patent: Aug. 4, 1992

[54] TRANSMITTER INCLUDING AN FSK MODULATOR HAVING A SWITCHED CAPACITOR

[75] Inventor: Gregg Nardozza, Hardyston, N.J.

[73] Assignee: AT&T Bell Laboratories, Murray Hill, N.J.

[21] Appl. No.: 622,704

[22] Filed: Dec. 5, 1990

[51] Int. Cl.⁵ .................. H03K 5/01; H04L 27/12
[52] U.S. Cl. .................. 332/102; 307/261;
    307/265; 328/31; 328/111; 331/75; 331/179;
    375/65; 359/181
[58] Field of Search .................. 332/100, 101, 102;
    331/179; 375/45, 62, 65; 455/609, 610, 611;
    331/74, 75, 77; 307/261, 265; 328/28, 31, 111

[56] References Cited

U.S. PATENT DOCUMENTS

| | | | |
|---|---|---|---|
| 4,174,534 | 11/1979 | Kotlarewsky | 363/26 |
| 4,449,247 | 5/1984 | Waschka, Jr. | 455/601 X |
| 4,573,025 | 2/1986 | McKinzie, III | 331/117 D |
| 4,603,301 | 7/1986 | Dukes et al. | 329/336 |
| 4,694,262 | 9/1987 | Inoue et al. | 331/179 X |
| 4,716,383 | 12/1987 | Lofgren et al. | 331/117 FE |
| 4,918,296 | 4/1990 | Fujisaka et al. | 235/380 |
| 4,959,557 | 9/1990 | Miller | 307/26 J |
| 4,959,827 | 9/1990 | Grotzinger et al. | 455/609 X |

*Primary Examiner*—Siegfried H. Grimm
*Attorney, Agent, or Firm*—Lester H. Birnbaum

[57] ABSTRACT

A transmitter including a continuous phase FSK modulator is disclosed for use primarily in optical transmission. The output frequencies are achieved by switching a capacitor into and out of an oscillator circuit by means of a PIN diode switch network which is responsive to a binary data input. The resulting sinusoidal waveforms are squared up by means of an inverte with feedback control for adjusting the duty cycle.

12 Claims, 3 Drawing Sheets

5,136,264

TRANSMITTER INCLUDING AN FSK MODULATOR HAVING A SWITCHED CAPACITOR

BACKGROUND OF THE INVENTION

This invention relates to transmitters which include frequency shift key modulation.

FSK (Frequency Shift Key) modulators are employed in optical data transmission to produce different frequencies corresponding to a binary data input stream. Most existing modulators employ a varactor diode to vary the capacitance of an oscillator circuit and, therefore, the output frequency. The problem with such a technique is that the capacitance vs. voltage characteristic of the varactor tends to vary from part to part and over temperature. Alternatively, a modulator may employ switching between two crystal oscillators, but this tends to produce discontinuous phase transitions in the output.

Recently, it has been proposed in an article identification system to utilize an FSK modulator which switches a capacitor or inductor into and out of an oscillator circuit in order to vary the frequency output (see U.S. Pat. No. 4,918,296 issued to Fujisaka et al). The switches employed were bipolar transistors. Use of such transistors would not be advantageous at the high frequencies required for the present application due to the relatively high and non-linear rf resistance the transistor would exhibit in the saturated state. Also, the oscillator signal amplitude would need to be small to avoid conduction of the collector-base junction of the transistor in the off-state.

A further problem with present modulators used in optical transmission involves producing a square wave output signal with a fixed duty cycle (usually higher than 50 percent) suitable for driving an optical device. High speed comparators could be used, but would tend to draw excessive power. Recent proposals have included the use of an inverter to produce the square wave, but generally without any means for fixing the duty cycle in spite of changes in the inverter threshold (see, e.g., U.S. Pat. No. 4,716,383 issued to Lofgren et al, U.S. Pat. No. 4,174,534 issued to Kotlarewsky, and U.S. Pat. No. 4,603,301 issued to Dukes, et al).

SUMMARY OF THE INVENTION

The invention, in one aspect, is a transmitter including a Frequency Shift Key modulator comprising an oscillator circuit adapted to produce a specific output level frequency. A capacitor is coupled in parallel with the oscillator circuit, and means are provided for switching the capacitor into and out of the parallel connection with the oscillator circuit in order to change the output frequency. The switching means is responsive to a binary data input and comprises a PIN diode.

BRIEF DESCRIPTION OF THE DRAWING

These and other features are delineated in detail in the following description. In the drawing.

DETAILED DESCRIPTION

Figure 1:
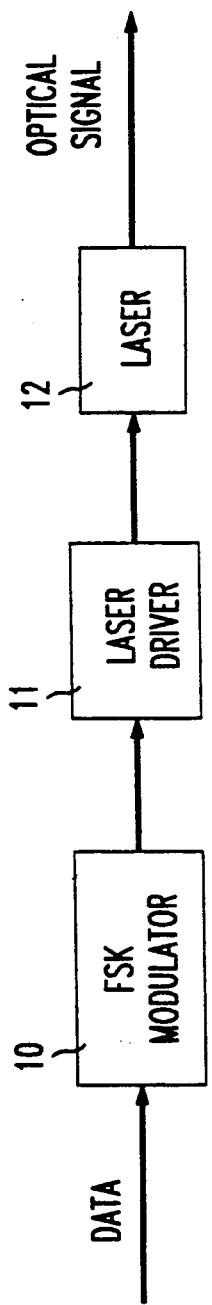
FIG. 1 is a block diagram illustrating portions of an optical transmitter in accordance with an embodiment of the invention.

FIG. 1 illustrates portions of a typical optical transmitter which utilizes an FSK modulator. Binary data is received by the modulator illustrated as block 10. The modulator converts the binary data into a duty cycle controlled square wave output signal having two frequencies. The high frequency typically corresponds to a "1" and the low frequency to a "0" of the binary data input. This output is coupled to a laser driver indicated by block 11 which creates the drive signal needed for the laser. The output of the laser driver is applied to a standard laser illustrated by block 12 to produce the optical signal which also comprises two frequencies correpsonding to the original data input. Typically, the optical frequencies are at 11.85 MHz and 13.09 MHz.

Figure 2:
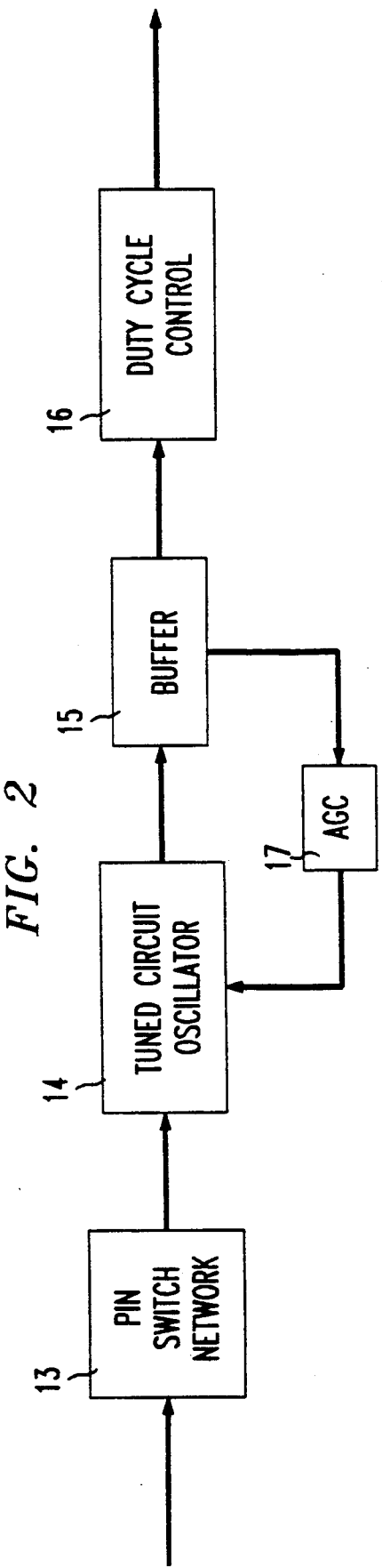
FIG. 2 is a block diagram illustrating portions of an FSK modulator in accordance with the same embodiment.

FIG. 2 illustrates in a block diagram further details of the modulator 10. The data input is coupled to a PIN switch network, 13, to be described, which operates on a tuned circuit oscillator 14. In a manner to be described, the oscillator is adapted to produce two sinusoidal output frequencies depending upon the state of the switch network 13. The resulting signal is coupled to a buffer circuit 15 which prevents loading of the tuned oscillator circuit by other circuitry coupled thereto. The buffer also provides a feedback signal to an automatic gain control circuit, 17, applied to the oscillator 14. The output of the buffer is applied to a duty cycle control circuit, 16, to be described, which squares up the sinusoidal signal and adjusts the duty cycle to be compatible with the laser to be driven.

Figure 3:
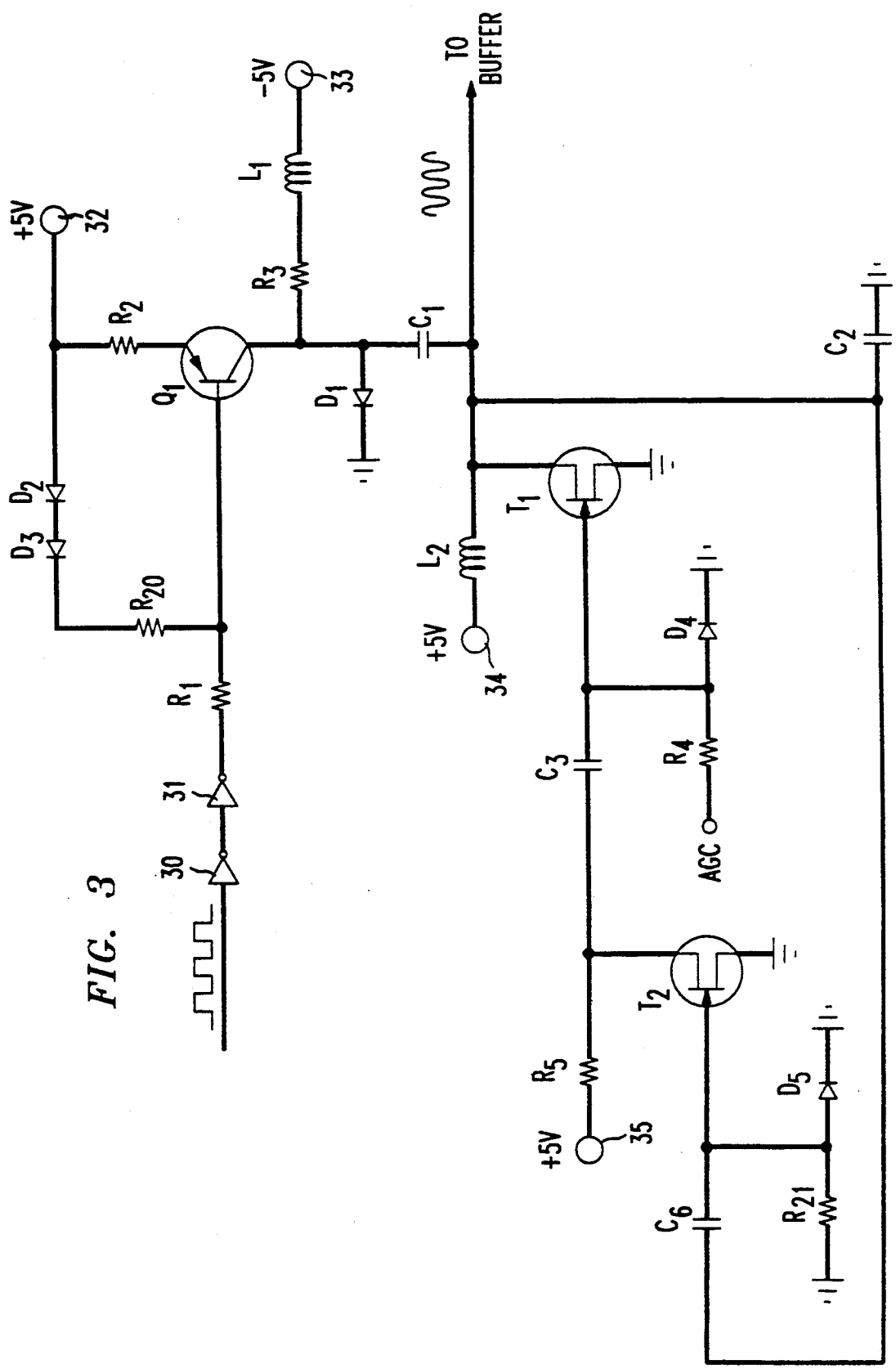
FIG. 3 is a circuit diagram of a portion of the modulator in accordance with the same embodiment.

FIG. 3 illustrates in more detail the portions of the modulator including the PIN switch network and oscillator circuit. The binary data input stream is coupled to the base of a bipolar transistor $Q_1$ through a pair of inverters, 30 and 31, and a voltage divider formed by resistors $R_1$ and $R_{20}$. A dc voltage of approximately +5 volts, in this example, is applied at terminal 32 to bias the emitter of transistor $Q_1$ through resistor $R_2$. The collector $Q_1$ is coupled to the anode of PIN diode, $D_1$, whose cathode is coupled to ground potential. A dc voltage of approximately −5 volts, in this example, is applied at terminal 33 and is also coupled to the anode of diode $D_1$ through inductor $L_1$ and resistor $R_3$.

One plate of capacitor $C_1$ is also coupled to the anode of PIN diode $D_1$, and the other plate of capacitor $C_1$ is coupled to the drain of field effect transistor (FET) $T_1$. Also coupled to the drain of $T_1$ is one plate of capacitor $C_2$, while its other plate is coupled to ground potential. Feedback for oscillation is provided from the drain of $T_1$ to the gate of $T_2$ through capacitor $C_6$.

Transistor $T_1$ has its drain biased by a constant dc potential at terminal 34, which in this example is +5 volts. The bias is supplied through inductor $L_2$. The source of the transistor is grounded. The gate of the transistor $T_1$ is coupled to the drain of field effect transistor $T_2$ through a capacitor $C_3$, and also to the automatic gain control circuit (17 of FIG. 2) through a resistor $R_4$. A diode, $D_4$, is coupled between the gate of $T_1$ and ground.

Transistor $T_2$ has its drain biased by a constant dc voltage applied at terminal 35, which in this example is approximately +5 volts. The bias is supplied through a resistor $R_5$. The source of transistor $T_2$ is grounded. The gate of $T_2$ is coupled through a capacitor $C_6$ to the feedback from the drain of $T_1$. Diode $D_5$ and resistor $R_{21}$ are couple between the gate of $T_2$ and ground.

In operation, it will be recognized that the combination, including $T_1$, $T_2$, $L_2$, $C_2$, comprises a tuned oscillator circuit producing a specified frequency at the output to the buffer, which in this particular example was 13.09 MHz and constitutes the high frequency for the modulator. That is, $T_2$ will invert and amplify the signal from the drain of $T_1$, and re-apply it to the gate of $T_1$, which also inverts and amplifies the signal, and the circuit will oscillate at a frequency according to the value of $L_2$ and $C_2$. When $C_1$ is coupled into the circuit parallel to $C_2$, the increased capacitance lowers the output frequency to a value, which in this example was 11.85 MHz, constituting the low frequency of the modulator.

The switching of capacitor $C_1$ is controlled by the network comprising PIN diode $D_1$, transistor $Q_1$, inductor $L_1$ and resistor $R_3$. It will be recognized that $Q_1$, along with $R_1$, $R_{20}$, $R_2$, $D_2$ and $D_3$, constitute a switchable current source. Thus, when the data input is low (i.e., a "0"), the base of $Q_1$ is biased at a potential, such that a fixed current will flow from the collector through the diode $D_1$ so that the diode $D_1$ will exhibit a low rf resistance. This will bring $C_1$ into active connection in parallel with the capacitor $C_2$, thus increasing the capacitance and lowering the output frequency of the oscillator. When the data input is high (a "1"), however, $Q_1$ will shut off. The bias at terminal 33 through the inductor $L_1$ and resistor $R_3$ will reverse bias diode $D_1$ so that $D_1$ will now exhibit a high rf resistance (i.e., low capacitance) thereby effectively disconnecting $C_1$ from the oscillator circuit. This reduces the total capacitance and raises the output frequency to its higher level. The data rate in this example was 1.544 Mbit/sec.

For this application, the PIN diode $D_1$ can be a standard switching diode with a low rf resistance (typically 1 ohm) at forward bias and a low capacitance (typically 0.7 pF) at reverse bias. A proper carrier lifetime for the output frequencies in this example would be 150 ns, and an appropriate reverse recovery time for the data rate in this example would be 50 ns.

Figure 4:
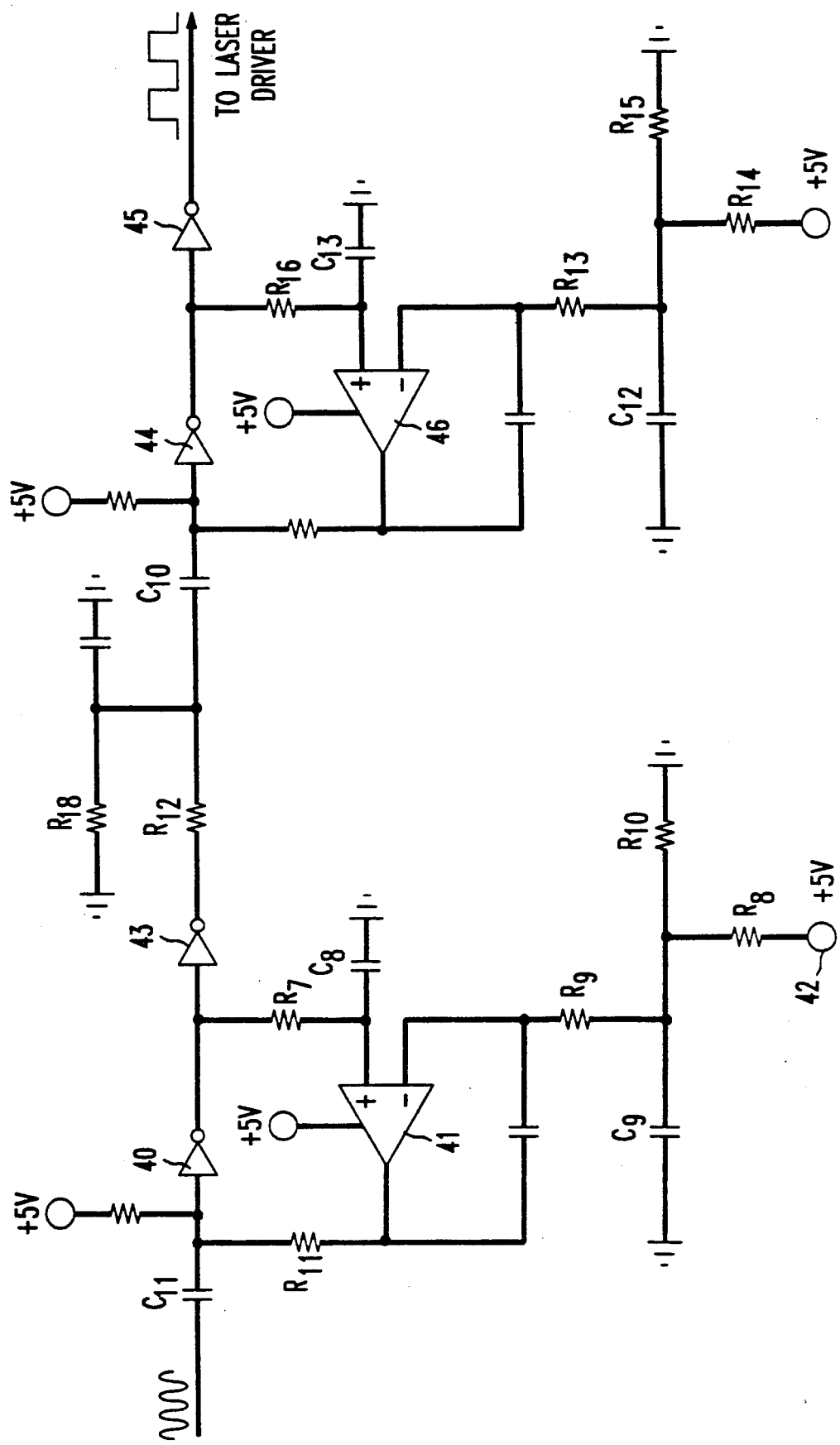
FIG. 4 is a circuit diagram of a further portion of the modulator in accordance with the same embodiment.

The output of the circuit of FIG. 3, after passing through a buffer circuit (15 of FIG. 2) is then coupled to the circuit of FIG. 4. The signal is first coupled to an inverter 40 through capacitor $C_{11}$. Coupled between the output of the inverter and ground is a series connection of a resistor $R_7$ and capacitor $C_8$. The node between $R_7$ and $C_8$ is coupled to the noninverting (+) input of an operational amplifier (op amp), 41, A constant dc voltage at terminal, 42, in this example approximately +5V, is divided down and filtered to form a reference voltage by $R_8$, $R_{10}$, and $C_9$. This reference voltage is applied to the inverting (−) input of the op amp through resistor $R_9$. The output of the op amp is coupled to the input of inverter 40 through resistor $R_{11}$. The output of inverter 40 is also coupled to a second inverter 43, which is used for buffering the output of inverter 40.

In operation, the sinusoidal signal at the input of inverter 40 will be transformed into a square wave signal of reversed polarity at the output, and then returned to the original polarity after being sent through inverter 43. Since the threshold of the inverter will vary, op amp 41 is utilized to adjust the dc level of the sinusoidal input signal so that it will always produce a fixed duty cycle for the output square wave, which, in this example is a duty cycle of 50 percent. This is achieved by coupling the output signal through a low pass filter formed by the combination of resistor $R_7$ and capacitor $C_8$, and applying it to the "+" input of the op amp. The values of the resistor $R_7$ and capacitor $C_8$ are chosen so that the resulting signal applied to the op amp input is a dc signal equal to the duty cycle of the square wave signal output of the inverter, 40, multiplied by the supply voltage. In this example, the resistance of $R_7$ was 10K ohms, the capacitance of $C_8$ was 0.1 microfarads and the supply voltage was +5 volts.

Meanwhile, resistors $R_8$ and $R_{10}$ are chosen so that the reference voltage applied to the inverting (−) input of the op amp is equal to the voltage which will give the desired duty cycle, in this example 0.5 times the supply voltage, or 2.5 volts. In this example, the resistance of the resistors $R_8$ and $R_{10}$ was 10K ohms each. The output of op amp 41 applied back to the input of inverter 40 will, therefore, adjust the dc level of the input sinusoidal signal until the noninverting (+) input of the op amp is also at 2.5 volts. At that time, the output of inverter 40 will be at the desired 50 percent duty cycle, and op amp 41 will go into a quiescent state until such time as the threshold of inverter 40 should change and alter the duty cycle.

Due to the inherent turn-on delay of laser diodes, it is known that the electrical drive duty cycle should be greater than 50 percent to achieve a 50 percent optical waveform duty cycle. In this example, the required duty cycle is approximately 60 percent. Consequently, the output of inverter 43 is coupled, through resistors $R_{12}$, $R_{18}$, and capacitor $C_{10}$, to inverters 44 and 45 where the operation of duty cycle adjustment is repeated by op amp 46. The purpose of $R_{12}$, $R_{18}$ and $C_{10}$ is to convert the square wave output of inverter 43 into a triangular wave so that duty cycle adjustment can be repeated. This time, however, resistors $R_{14}$ and $R_{15}$ are chosen to produce a reference voltage of approximately 0.4 times the supply voltage, or 1 volt, at the inverting (−) input to achieve a 40 percent duty cycle signal at the output of inverter 44 so that the output of inverter 45 produces the desired 60 percent duty cycle. The signal is then sent to the laser driver to produce the optical output signal.

It will be understood that the 60 percent duty cycle is not produced in one stage due to amplitude variations in the sine wave input to inverter 40 which occur in the oscillator circuit during the data transitions. Such amplitude variations would cause duty cycle jitter for any value other than 50 percent.

It will be appreciated from the above that any desired duty cycle can be achieved in accordance with this aspect of the invention by an appropriate choice of reference voltage.

Various additional modifications will become apparent to those skilled in the art. All such variations which basically rely on the teachings through which the invention has advanced the art are properly considered within the scope of the invention.

I claim:

1. A transmitter including a Frequency Shift Key modulator comprising:

an oscillator circuit adapted to produce a specific output frequency;

a capacitor coupled in parallel with said oscillator circuit; and means responsive to a binary data input for switching the capacitor into and out of the parallel connection with the oscillator circuit in order to change the output frequency, said means comprising a PIN diode and a switchable current source coupled between the diode and the binary data input.

2. A device according to claim 1 wherein the current source includes a bipolar transistor with its base coupled to the binary input and its collector coupled to the PIN diode.

3. A device according to claim 1 further comprising means for reverse-biasing the diode in order to switch the capacitor out of connection with the oscillator circuit.

4. A device according to claim 1 wherein the switching means further comprises:
 a bipolar transistor having its collector coupled to the PIN diode and its base coupled to the binary data input; and
 means including a resistor and inductor for reverse-biasing the PIN diode sufficiently to switch the capacitor out of connection with the oscillator circuit when the transistor is non-conducting.

5. A device according to claim 1 further comprising a laser for transmitting an optical signal corresponding to said data input.

6. A device according to claim 1 further comprising means for producing a square wave pattern in response to said output frequency.

7. A device according to claim 6 wherein said means for producing a square wave comprises an inverter.

8. A device according to claim 7 further comprising:
 a low pass filter coupled to the output of the inverter and to one input of an operational amplifier, and circuit means for producing a reference voltage at another input to the operational amplifier, the output of the operational amplifier being coupled to the input of the inverter to adjust the dc level of the input and thereby control the duty cycle of the square wave.

9. A transmitter including circuit means for converting a sinusoidal signal to a square wave signal having a predetermined duty cycle, said means comprising:
 an inverter having an input coupled to the sinusoidal signal and having an output;
 an operational amplifier having an output coupled to the input of the inverter, and also having two inputs;
 a low pass filter coupled between the output of the inverter and an input of the operational amplifier;
 circuit means for providing a reference voltage at the other input of the operational amplifier corresponding to the predetermined duty cycle; and
 an additional inverter, operational amplifier, low pass filter, and circuit means for further adjusting the duty cycle of the square wave at the output of the first inverter.

10. A device according to claim 9 wherein the low pass filter comprises a resistor and capacitor.

11. A device according to claim 9 wherein the circuit means for providing the voltage reference comprises a plurality of resistors.

12. A device according to claim 9 further comprising a second inverter coupled to the output of the inverter.

* * * * *

UNITED STATES PATENT AND TRADEMARK OFFICE
CERTIFICATE OF CORRECTION

PATENT NO. : 5,136,264
DATED : August 4, 1992
INVENTOR(S) : Gregg Nardozza

It is certified that error appears in the above-indentified patent and that said Letters Patent is hereby corrected as shown below:

On the title page: Item [75],"Hardyston" should read --Township of Hardyston--.

ABSTRACT, Item [57], line 8, "inverte" should read --inverter--.

Column 1, line 53, "level frequency" should read --freguency--.
Column 2, line 44, "collector" should read --collector of--.

Signed and Sealed this

First Day of March, 1994

Attest:

BRUCE LEHMAN

Attesting Officer

Commissioner of Patents and Trademarks